(12) United States Patent
Chen et al.

(10) Patent No.: US 10,627,972 B2
(45) Date of Patent: Apr. 21, 2020

(54) CAPACITANCE DETECTING DEVICE, TOUCH DEVICE AND TERMINAL DEVICE

(71) Applicant: SHENZHEN GOODIX TECHNOLOGY CO., LTD., Shenzhen (CN)

(72) Inventors: Tujiang Chen, Shenzhen (CN); Hong Jiang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/265,739

(22) Filed: Feb. 1, 2019

(65) Prior Publication Data

US 2019/0171312 A1   Jun. 6, 2019

Related U.S. Application Data

(63) Continuation of application No. PCT/CN2017/109983, filed on Nov. 8, 2017.

(51) Int. Cl.
  *G06F 3/045*       (2006.01)
  *G06F 3/044*       (2006.01)
  (Continued)

(52) U.S. Cl.
  CPC .......... *G06F 3/044* (2013.01); *G06F 3/0416* (2013.01); *G06F 3/04166* (2019.05);
  (Continued)

(58) Field of Classification Search
  CPC ...... G06F 3/041; G06F 3/0412; G06F 3/0418; G06F 3/044; H03F 3/45; H03F 3/45475; G06K 9/00; G06K 9/0002
  See application file for complete search history.

(56) References Cited

U.S. PATENT DOCUMENTS

| 10,345,980 B2 * | 7/2019 | Jiang ................... G06F 3/0414 |
| 2008/0069413 A1 * | 3/2008 | Riedijk ............... G06K 9/0002 382/124 |

(Continued)

FOREIGN PATENT DOCUMENTS

| CN | 102541367 A | 7/2012 |
| CN | 103324366 B | 9/2016 |

(Continued)

*Primary Examiner* — Joe H Cheng

(57) ABSTRACT

Provided is a capacitance detecting device (801) which includes a charging module (110) configured to charge a base capacitor (130) between a detecting electrode and system ground; an integrating circuit (150) including an amplifier (151) and an integrating capacitor (152), where the integrating capacitor (152) is connected in parallel with the amplifier (151), the integrating circuit (150) is configured to integrate, charges transferred from the base capacitor (130); a cancellation capacitor (120) configured to cancel a contribution of the base capacitor (130) to an output voltage of the amplifier (151); a controlling module (140) configured to control the charging module (110) to charge the base capacitor (130) in a first phase, control the charging module (110) to stop charging the base capacitor (130) in a second phase, control transfer of the charges on the base capacitor (130) to the integrating capacitor (152) in a third phase.

19 Claims, 6 Drawing Sheets

(51) Int. Cl.
*H03F 3/45* (2006.01)
*G06F 3/041* (2006.01)

(52) U.S. Cl.
CPC ... *H03F 3/45475* (2013.01); *H03F 2200/129* (2013.01); *H03F 2203/45116* (2013.01); *H03F 2203/45514* (2013.01)

(56) References Cited

U.S. PATENT DOCUMENTS

| | | | | |
|---|---|---|---|---|
| 2008/0111714 | A1* | 5/2008 | Kremin | G06F 3/044 341/33 |
| 2009/0032312 | A1 | 2/2009 | Huang et al. | |
| 2009/0243631 | A1* | 10/2009 | Kuang | G01R 27/2605 324/658 |
| 2010/0085322 | A1* | 4/2010 | Mamba | G06F 3/044 345/173 |
| 2011/0261006 | A1* | 10/2011 | Joharapurkar | G06F 3/0416 345/174 |
| 2012/0218222 | A1* | 8/2012 | Shen | G06F 3/0418 345/174 |
| 2016/0350577 | A1* | 12/2016 | Yang | G06K 9/00053 |
| 2016/0370948 | A1* | 12/2016 | Lee | G06F 3/0418 |
| 2016/0370949 | A1* | 12/2016 | Park | G06F 3/044 |
| 2017/0116452 | A1* | 4/2017 | Wang | G06K 9/0002 |
| 2017/0293376 | A1* | 10/2017 | Tang | G06F 3/044 |
| 2018/0121699 | A1 | 5/2018 | Zhang et al. | |
| 2018/0150157 | A1 | 5/2018 | Fan | |
| 2019/0138782 | A1* | 5/2019 | Zhang | G06F 3/04166 |

FOREIGN PATENT DOCUMENTS

| | | |
|---|---|---|
| CN | 103902123 B | 4/2017 |
| CN | 106557724 A | 4/2017 |
| CN | 106598370 A | 4/2017 |
| CN | 106663202 A | 5/2017 |
| EP | 3343335 A1 | 7/2018 |
| EP | 3502855 A1 * | 6/2019 |

* cited by examiner

300

CAPACITANCE DETECTING DEVICE, TOUCH DEVICE AND TERMINAL DEVICE

CROSS-REFERENCE TO RELATED APPLICATIONS

This application is a continuation of International Application No. PCT/CN2017/109983, filed on Nov. 8, 2017, the disclosure of which is hereby incorporated by reference in its entirety.

TECHNICAL FIELD

Embodiments of the present application relate to the field of capacitance detection, and in particular, to a capacitance detecting device, a touch device, and a terminal device.

BACKGROUND

Self-capacitance detection technologies are widely used in the field of human-computer interaction of an electronic product, and specifically, a capacitance (a self-capacitance, or a base capacitance) is formed between a detecting electrode and ground, when a conductor (such as a finger) approaches or touches the detecting electrode, the capacitance between the detecting electrode and the ground varies, and information that the conductor approaches or touches the detecting electrode is obtained by detecting an amount of variation in the capacitance.

In some scenarios, for example, a touch screen of a smart phone requires high sensitivity for capacitance detection; for example, a self-capacitance of the detecting electrode to the ground is 1 pF, and when the finger is 30 mm away from the detecting electrode, the self-capacitance of the detecting electrode is increased by 1 fF, that is, signal weight is only 0.1%; in order to extract a useful signal, it is common to use a cancellation circuit to remove a useless signal contributed by a base capacitance of the detecting electrode, that is, 1 pF. However, for a conventional cancellation circuit, there is transient overshoot when driving with a square wave, and an amplitude and a slope of an overshoot voltage are related to parameters of a trace resistance and a parasitic capacitance of the detecting electrode. Therefore, an effective cancellation effect cannot be achieved, and sensitivity of capacitance detection is reduced.

Therefore, a self-capacitance detecting method which can improve the sensitivity of the capacitance detection is required.

SUMMARY

Embodiments of the present application provide a capacitance detecting device, a touch device, and a terminal device, which can improve sensitivity of capacitance detection.

In a first aspect, provided is a capacitance detecting device, comprising: a charging module, configured to charge a base capacitor between a detecting electrode and system ground; an integrating circuit including an amplifier and an integrating capacitor, where the integrating capacitor is connected in parallel with the amplifier, and the integrating circuit is configured to integrate, through the integrating capacitor, charges transferred from the base capacitor; a cancellation capacitor, configured to cancel a contribution of the base capacitor to an output voltage of the amplifier; and a controlling module, configured to control the charging module to charge the base capacitor in a first phase, control the charging module to stop charging the base capacitor in a second phase, and control transfer of the charges on the base capacitor to the integrating capacitor in a third phase; where a charging voltage of the charging module, a capacitance of the integrating capacitor and a capacitance of the cancellation capacitor cause the contribution of the base capacitor to the output voltage of the amplifier to be zero.

Therefore, according to a capacitance detecting device of an embodiment of the present application, by designing a charging voltage of a charging module and capacitances of an integrating capacitor and a cancellation capacitor, a contribution of a base capacitor to an output voltage of an amplifier may be zero, and thus, when a conductor (such as a finger) approaches or touches a detecting electrode, signals output by the capacitance detecting device are useful signals, that is, the signals are contributed by $\Delta C_S$, thereby improving the sensitivity of the capacitance detection. Moreover, by setting a dead zone between a charging phase and a charge transfer phase, a problem that a signal contributed by the base capacitor cannot be effectively cancelled due to presence of transient overshoot when driving with a square wave, thereby affecting the sensitivity of the capacitance detection can be avoided.

According to the first aspect, in some implementations of the first aspect, the controlling module includes a charging switch set, a discharging switch set and a clearing switch set, the charging switch set is connected to the charging module, one end of the discharging switch set is connected to the charging module, and the other end of the discharging switch set is connected to the integrating circuit; where the charging switch set is configured to control the charging module to charge the base capacitor in the first phase, and stop charging the base capacitor in the second phase and the third phase; the discharging switch set is configured to control the transfer of the charges on the base capacitor to the integrating capacitor in the third phase; and the clearing switch set is configured to control clear of charges on the integrating capacitor in the first phase and the second phase.

According to the first aspect, in some implementations of the first aspect, the charging voltage of the charging module includes a driving voltage and a reference voltage; in the first phase, the driving voltage and the reference voltage charge the base capacitor and the cancellation capacitor; and in the second phase and the third phase, the driving voltage and the reference voltage stop charging the base capacitor and the cancellation capacitor.

According to the first aspect, in some implementations of the first aspect, the charging switch set includes a first switch, and the discharging switch set includes a second switch, one end of the cancellation capacitor is connected to the driving voltage, the other end of the cancellation capacitor is connected to one end of the base capacitor, and the other end of the base capacitor is grounded; and one end of the first switch is connected to the reference voltage, the other end of the first switch is connected to one end of the base capacitor and one end of the second switch, and the other end of the second switch is connected to the amplifier.

According to the first aspect, in some implementations of the first aspect, the amplifier is a single-ended amplifier, the amplifier includes a first input end, a second input end and an output end, the clearing switch set includes a third switch, the third switch is connected in parallel with the integrating capacitor, one end of the integrating capacitor is connected to the first input end of the amplifier, the other end of the integrating capacitor is connected to the output end of the amplifier, and the second input end of the amplifier is configured to input a common mode voltage; or the amplifier is a differential amplifier including a first input end, a second input end, a common mode input end, a first output end and a second output end, where the integrating capacitor includes a first integrating capacitor and a second integrating capacitor, and the clearing switch set includes a third switch and a fourth switch; the third switch is connected in parallel with the first integrating capacitor, one end of the first integrating capacitor is connected to the first input end of the amplifier, and the other end of the first integrating capacitor is connected to the first output end of the amplifier; the fourth switch is connected in parallel with the second integrating capacitor, one end of the second integrating capacitor is connected to the second input end of the amplifier, the other end of the second integrating capacitor is connected to the second output end of the amplifier, and the second input end and the common mode input end of the amplifier are configured to input a common mode voltage.

According to the first aspect, in some implementations of the first aspect, the reference voltage, the common mode voltage, the driving voltage, a capacitance of the base capacitor and the capacitance of the cancellation capacitor satisfy the following equation such that the contribution of the base capacitor to the output voltage of the amplifier is zero:

$$(V_{ref} - V_{com}) \times (C_S + C_C) = V_{tx} \times C_C$$

where the $V_{ref}$ is an amplitude of the reference voltage, the $V_{com}$ is the common mode voltage, the $V_{tx}$ is an amplitude of the driving voltage, the $C_S$ is the capacitance of the base capacitor, and the $C_C$ is the capacitance of the cancellation capacitor.

According to the first aspect, in some implementations of the first aspect, the charging voltage of the charging module includes a driving voltage; in the first phase, the driving voltage charges the base capacitor; in the second phase and the third phase, the driving voltage stops charging the base capacitor.

According to the first aspect, in some implementations of the first aspect, the charging switch set includes a first switch and the discharging switch set includes a second switch and a third switch; one end of the first switch is connected to the driving voltage, the other end of the first switch is connected to one end of the second switch, one end of the third switch and one end of the base capacitor, and the other end of the base capacitor is grounded; and the other end of the second switch is connected to one end of the cancellation capacitor, and the other end of the third switch is connected to the amplifier.

According to the first aspect, in some implementations of the first aspect, the amplifier is a single-ended amplifier, the amplifier includes a first input end, a second input end and an output end, the clearing switch set includes a fourth switch and a fifth switch, the fourth switch is connected in parallel with the cancellation capacitor, the fifth switch is connected in parallel with the integrating capacitor, one end of the integrating capacitor is connected to the first input end of the amplifier, the other end of the integrating capacitor is connected to the output end of the amplifier, and the second input end of the amplifier is configured to input a common mode voltage; or the amplifier is a differential amplifier including a first input end, a second input end, a common mode input end, a first output end and a second output end, the integrating capacitor includes a first integrating capacitor and a second integrating capacitor, and the clearing switch set includes a fourth switch, a fifth switch and a sixth switch; where the fourth switch is connected in parallel with the cancellation capacitor; the fifth switch is connected in parallel with the first integrating capacitor, one end of the first integrating capacitor is connected to the first input end of the amplifier, and the other end of the first integrating capacitor is connected to the first output end of the amplifier; the sixth switch is connected in parallel with the second integrating capacitor, one end of the second integrating capacitor is connected to the second input end of the amplifier, the other end of the second integrating capacitor is connected to the second output end of the amplifier, and the second input end and the common mode input end of the amplifier are configured to input a common mode voltage.

According to the first aspect, in some implementations of the first aspect, the reference voltage, the driving voltage, the common mode voltage, and a capacitance of the base capacitor and the capacitance of the cancellation capacitor satisfy the following equation such that the contribution of the base capacitor to the output voltage of the amplifier is zero:

$$(V_{tx} - V_{com}) \times C_S = V_{com} \times C_C$$

where the $V_{tx}$ is an amplitude of the driving voltage, the $V_{com}$ is the common mode voltage, the $C_S$ is the capacitance of the base capacitor, and the $C_C$ is the capacitance of the cancellation capacitor.

According to the first aspect, in some implementations of the first aspect, the charging voltage of the charging module includes a driving voltage, a reference voltage and a floating ground voltage; in the first phase, the driving voltage, the reference voltage and the floating ground voltage charge the base capacitor and the cancellation capacitor; and in the second phase and the third phase, the driving voltage, the reference voltage and the floating ground voltage stop charging the base capacitor and the cancellation capacitor.

According to the first aspect, in some implementations of the first aspect, the charging switch set includes a first switch, and the discharging switch set includes a second switch; where one end of the cancellation capacitor is connected to the driving voltage, the other end of the cancellation capacitor is connected to one end of the base capacitor, and the other end of the base capacitor is connected to the floating ground voltage; and one end of the first switch is connected to the reference voltage, the other end of the first switch is connected to one end of the base capacitor and one end of the second switch, and the other end of the second switch is connected to the amplifier.

According to the first aspect, in some implementations of the first aspect, the amplifier is a single-ended amplifier, the amplifier includes a first input end, a second input end and an output end, the clearing switch set includes a third switch, the third switch is connected in parallel with the integrating capacitor, one end of the integrating capacitor is connected to the first input end of the amplifier, the other end of the integrating capacitor is connected to the output end of the amplifier, and the second input end of the integrating capacitor is configured to input a common mode voltage;

or the amplifier is a differential amplifier including a first input end, a second input end, a common mode input end, a first output end and a second output end, the integrating capacitor includes a first integrating capacitor and a second integrating capacitor, and the clearing switch set includes a third switch and a fourth switch; where the third switch is connected in parallel with the first integrating capacitor, one end of the first integrating capacitor is connected to the first input end of the amplifier, and the other end of the first integrating capacitor is connected to the first output end of the amplifier; the fourth switch is connected in parallel with the second integrating capacitor, one end of the second integrating capacitor is connected to the second input end of the amplifier, the other end of the second integrating capacitor is connected to the second output end of the amplifier, and the second input end and the common mode input end of the amplifier are configured to input a common mode voltage.

According to the first aspect, in some implementations of the first aspect, the floating ground voltage, the driving voltage, and a capacitance of the base capacitor and the capacitance of the cancellation capacitor satisfy the following equation such that the contribution of the base capacitor to the output voltage of the amplifier is zero:

$$V_{float} \times C_S = V_{tx} \times C_C$$

where the $V_{float}$ is an amplitude of the floating ground voltage, the $V_{tx}$ is an amplitude of the driving voltage, the $C_S$ is the capacitance of the base capacitor, and the $C_C$ is the capacitance of the cancellation capacitor.

In a second aspect, provided is a terminal device including the capacitance detecting device in the first aspect and any one of the possible implementations of the first aspect.

In a third aspect, provided is a touch device including the capacitance detecting device in the first aspect and any one of the possible implementations of the first aspect.

DESCRIPTION OF EMBODIMENTS

Embodiments of the present application will be described hereinafter in conjunction with the drawings in the embodiments of the present application.

Figure 1:
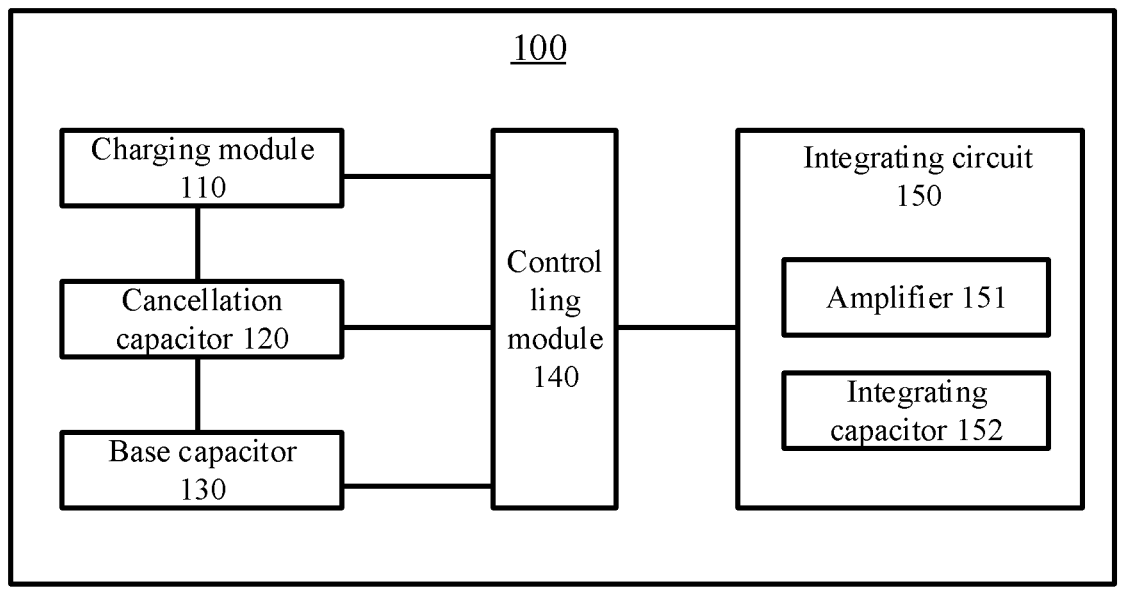
FIG. 1 is a schematic structural diagram of a capacitance detecting device according to an embodiment of the present application.

FIG. 1 is a schematic structural diagram of a capacitance detecting device 100 according to an embodiment of the present application. As shown in FIG. 1, the capacitance detecting device 100 includes:

a charging module 100, configured to charge a base capacitor 130 between a detecting electrode and system ground;

an integrating circuit 150 including an amplifier 151 and an integrating capacitor 152, where the integrating capacitor 152 is connected in parallel with the amplifier 151, and the integrating circuit 150 is configured to integrate, through the integrating capacitor 152, charges transferred from the base capacitor 130;

a cancellation capacitor 120, configured to cancel a contribution of the base capacitor 130 to an output voltage of the amplifier 151; and a controlling module 140, configured to control the charging module 110 to charge the base capacitor 130 in a first phase, control the charging module 110 to stop charging the base capacitor 130 in a second phase, and control transfer of the charges on the base capacitor 130 to the integrating capacitor 152 in a third phase;

where a charging voltage of the charging module, a capacitance of the integrating capacitor and a capacitance of the cancellation capacitor cause the contribution of the base capacitor to the output voltage of the amplifier to be zero.

It should be noted that system ground in an embodiment of the present application may be system ground of a system, to which the capacitance detecting device is applied, and the system to which the capacitance detecting device in the embodiment of the present application is applied may include a floating system and a non-floating system, or other systems requiring capacitance detection; in the non-floating system, one end of the base capacitor is connected to the system ground, and in the floating system, one end of the base capacitor is connected to the floating ground voltage, that is, it is not connected to the system ground.

Specifically, when the conductor does not approach or touch the detecting electrode, there is a base capacitance (or a self-capacitance, denoted as $C_S$) between the detecting electrode of the capacitance detecting device and the system ground; when the conductor (such as, a finger) approaches or touches the detecting electrode, the capacitance $C_S$ is increased by $\Delta C_S$, and the capacitance detecting device may determine information that the conductor approaches or touches the detecting electrode according to variation of a signal caused by $\Delta C_S$. However, if $\Delta C_S$ is small relative to $C_S$, a useful signal caused by $\Delta C_S$ may not be accurately detected. According to a capacitance detecting device of an embodiment of the present application, by designing a charging voltage of a charging module and capacitances of an integrating capacitor and a cancellation capacitor, a contribution of a base capacitor to an output voltage of an amplifier may be zero, and thus, when a conductor (such as, a finger) approaches or touches a detecting electrode, signals output by the capacitance detecting device are useful signals, that is, the signals are contributed by $\Delta C_S$, thereby improving sensitivity of capacitance detection. Optionally, the useful signals may also be amplified to obtain information that the finger approaches or touches the detecting electrode, thereby further improving the sensitivity of the capacitance detection.

In the embodiment of the present application, the controlling module may control the charging module to charge the base capacitor in the first phase (or may also be referred to as a charging phase), control the charging module to stop charging the base capacitor in the second phase (or may also be referred to as a dead zone phase), and control transfer of part of charges on the base capacitor to the integrating capacitor in the third phase (or may also be referred to as a charge transfer phase); that is, by setting the dead zone phase between the charging phase and the charge transfer phase, a problem that the signal contributed by the base capacitor cannot be effectively cancelled due to presence of transient overshoot when driving with a square wave, thereby affecting the sensitivity of the capacitance detection can be avoided.

It should be noted that in practical applications, since a supply voltage of the charging module, capacitances of the base capacitor and the integrating capacitor and a capacitance of the cancellation capacitor may all have certain errors, a contribution of the base capacitor to the output voltage of the amplifier may not be zero absolutely. The charging voltage of the charging module, the capacitance of the integrating capacitor and the capacitance of the cancellation capacitor causing the contribution of the base capacitor to the output voltage of the amplifier to be zero herein may be referred to that by controlling the charging voltage of the charging module, the capacitance of the integrating capacitor and the capacitance of the cancellation capacitor, the contribution of the base capacitor to the output voltage of the amplifier may be zero or approximately zero (that is, the contribution is less than a certain threshold or the contribution is relatively small).

Optionally, in an embodiment of the present application, the controlling module may include a charging switch set, a discharging switch set and a clearing switch set, the charging switch set is connected to the charging module, one end of the discharging switch set is connected to the charging module, and the other end of the discharging switch set is connected to the integrating circuit;

where the charging switch set is configured to control the charging module to charge the base capacitor in the first phase, and stop charging the base capacitor in the second phase and the third phase; the discharging switch set is configured to control the transfer of the charges on the base capacitor to the integrating capacitor in the third phase; and the clearing switch set is configured to control clear of charges on the integrating capacitor in the first phase and the second phase.

Specifically, the charging switch set may include at least one control switch, and the at least one control switch may be configured to control the charging module to charge the base capacitor in the first phase, and stop charging the base capacitor in the second phase and the third phase; for example, the at least one control switch may be in an on state in the first phase such that the charging module is connected to the base capacitor to charge the base capacitor, and may be in an off state in the second phase and the third phase, such that the charging module stops charging the base capacitor. Optionally, the discharging switch set may also include at least one control switch, where the at least one control switch may be in an off state in both the first phase and the second phase, and may be in an on state in the third phase, such that the base capacitor is connected to the integrating circuit and the integrating circuit may integrate charges transferred from the base capacitor. The clearing switch set may also include at least one control switch, the at least one control switch may be connected in parallel with the integrating capacitor, and may be in an on state in the first phase and the second phase, thereby ensuring charges on the integrating capacitor being zero in the first phase and the second phase.

Hereinafter, implementations of the capacitance detecting device according to the embodiment of the present application will be described in detail in conjunction with specific examples in FIGS. 2 to 10.

It should be understood that examples shown in FIGS. 2 to 10 are intended to help persons skilled in the art to better understand embodiments of the present application, and are not intended to limit the scope of the embodiments of the present application. It will be obvious to persons skilled in the art that various equivalent modifications or variations can be made according to the presented FIGS. 2 to 10, and such modifications or variations also fall within the scope of the embodiments of the present application.

Optionally, as one embodiment, the charging voltage of the charging module includes a driving voltage and a reference voltage; in the first phase, the driving voltage and the reference voltage charge the base capacitor and the cancellation capacitor; and in the second phase and the third phase, the driving voltage and the reference voltage stop charging the base capacitor and the cancellation capacitor.

Figure 2:
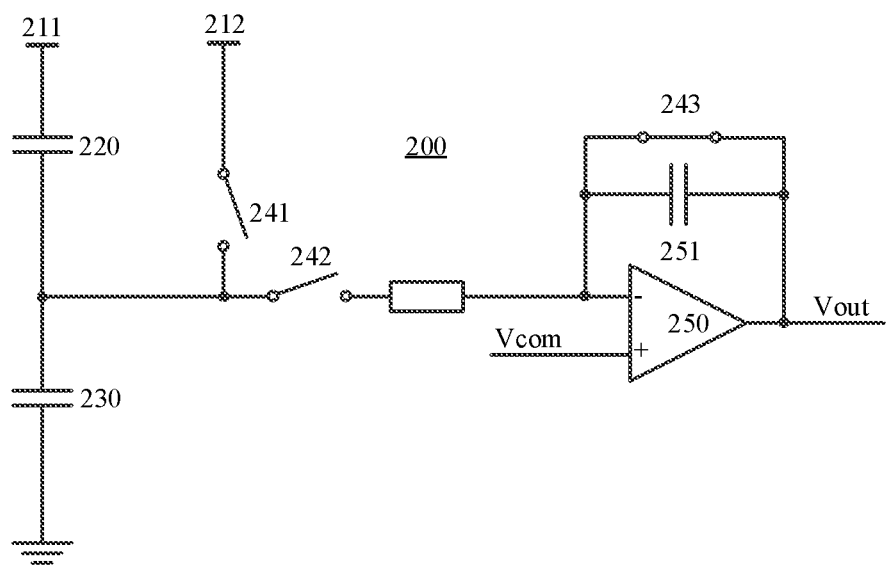
FIG. 2 is a circuit configuration diagram of a capacitance detecting device according to an embodiment of the present application.
Figure 4:
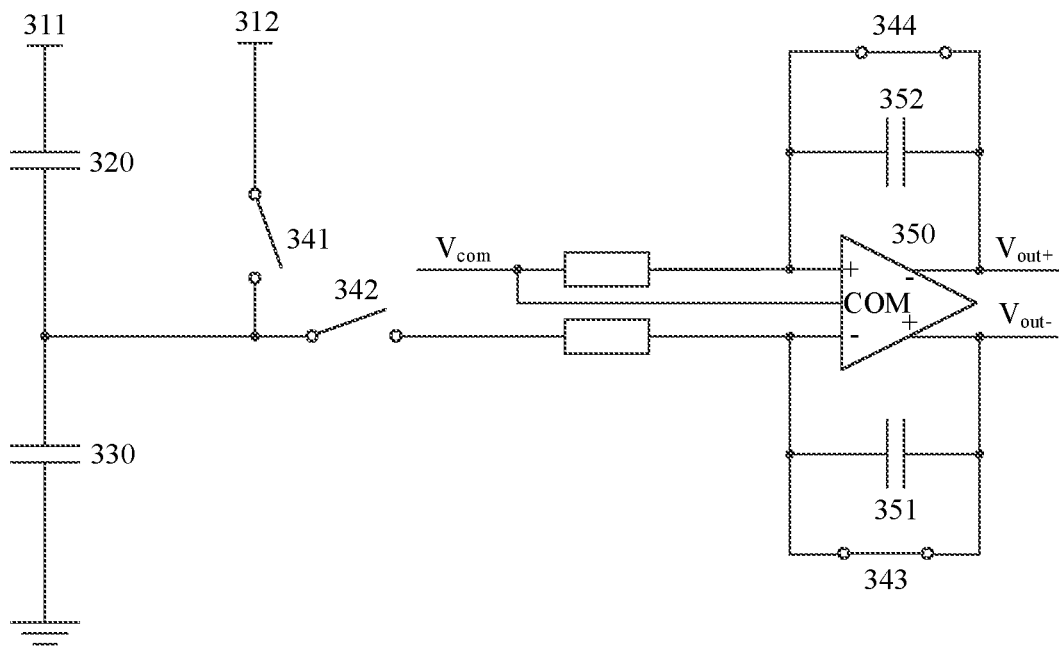
FIG. 4 is a circuit configuration diagram of a capacitance detecting device according to an embodiment of the present application.

In this case, the amplifier may be in a single-ended form or in a differential form. FIG. 2 shows a circuit configuration diagram of a capacitance detecting device using a single-ended amplifier, and FIG. 4 shows a circuit configuration diagram of a capacitance detecting device using a differential amplifier, and a specific working principle will be described below in detail in conjunction with FIGS. 2 and 4.

FIG. 2 is a circuit configuration diagram of a capacitance detecting device 200 using a single-ended amplifier.

The capacitance detecting device 200 includes a charging module, a controlling module, a cancellation capacitor 220, a base capacitor 230 and an integrating circuit, where a charging voltage of the charging module includes a driving voltage 211 and a reference voltage 212; a charging switch set in the controlling module includes a first switch 241, a discharging switch set includes a second switch 242, and a clearing switch set includes a third switch 243; and the integrating circuit includes an amplifier 250 and an integrating capacitor 251, the amplifier 250 includes a first input end (that is, an inverting input end, or a negative input end), a second input end (that is, a non-inverting input end, or a positive input end) and an output end.

Specifically, one end of the cancellation capacitor 220 is connected to the driving voltage 211, the other end of the cancellation capacitor 220 is connected to one end of the base capacitor 230, and the other end of the base capacitor 230 is grounded;

one end of the first switch 241 is connected to the reference voltage 212, the other end of the first switch 241 is connected to one end of the base capacitor 230, and one end of the second switch 242, and the other end of the second switch 242 is connected to the first input end of the amplifier 250; and the third switch 243 is connected in parallel with the integrating capacitor 251, one end of the integrating capacitor 251 is connected to the first input end of the amplifier 250, the other end of the integrating capacitor 251 is connected to the output end of the amplifier 250, and the second input end of the amplifier 250 is configured to input a common mode voltage.

Figure 3:
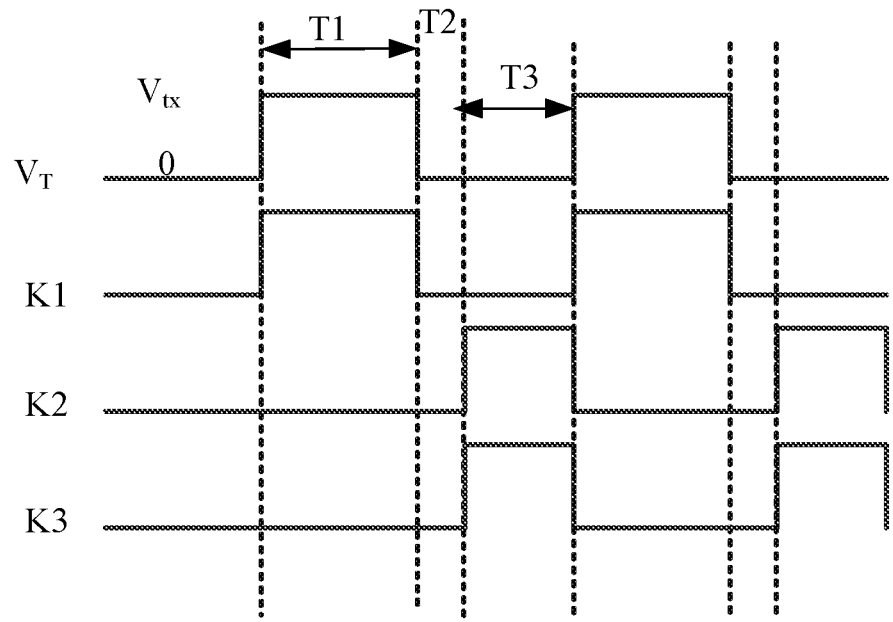
FIG. 3 is a logic timing diagram of a capacitance detecting device according to an embodiment of the present application.

Hereinafter, a working process of the capacitance detecting device shown in FIG. 2 will be described in detail in conjunction with a logical timing diagram shown in FIG. 3.

A first phase (that is, time period T1) is a charging phase, and in the first phase, a charging module charges the cancellation capacitor 220 and the base capacitor 230 and charges on an integrating capacitor are cleared. Specifically, a first switch 241 (denoted as K1) is turned on, and a second switch 242 (denoted as K2) is turned off, at this case, a driving voltage 211 (denoted as $V_T$) and a reference voltage charge the cancellation capacitor 220 and the base capacitor 230, an amplitude of the driving voltage $V_T$ is denoted as $V_{tx}$, an amplitude of the reference voltage is denoted as $V_{ref}$, a voltage on the base capacitor 230 is charged to $V_{ref}$, a voltage at one end of the cancellation capacitor 220 is $V_{tx}$, and a voltage at the other end thereof is $V_{ref}$, that is, a voltage drop across the cancellation capacitor 220 is $V_{tx}-V_{ref}$. In the charging phase, a third switch 243 (denoted as K3) is turned on, the charges on the integrating capacitor 251 are zero, and an output voltage of an amplifier 250 is the common mode voltage $V_{com}$;

a second phase (that is, time period T2) is a dead zone phase (or a buffer phase), and in the second phase, the first switch 241 and the second switch 242 are turned off, and the driving voltage 211 and the reference voltage 212 stop charging the cancellation capacitor 220 and the base capacitor 230, which is conducive to avoiding the influence of transient overshoot generated by driving with a square-wave on the sensitivity of the capacitance detection. In the second phase, the third switch 243 is still turned on, the output voltage of the amplifier 250 is still the common mode voltage $V_{com}$, and the charges on the integrating capacitor are still zero; and optionally, in the second phase, the driving voltage may be zero or a voltage value smaller than $V_{tx}$, and FIG. 3 only takes the driving voltage being zero in the second phase as an example, and should not constitute any limitation to the embodiment of the present application.

A third phase (that is, time period T3) is a charge transfer phase, and in the third phase, the first switch 241 is turned off, the second switch 242 is turned on, and the third switch 243 is turned off, part of charges on the cancellation capacitor 220 and the base capacitor 230 are transferred to the integrating capacitor 251, and heretofore, a driving cycle ends and the next driving cycle repeats the foregoing process, which will not be repeated redundantly herein.

That is, in the first phase, the first switch in the charging switch set and the third switch in the clearing switch set are turned on, and the second switch in the discharging switch set is turned off, so that the charging module may charge the base capacitor and the cancellation capacitor; in the third phase, the switches in the charging switch set and the clear switch set are turned off, and the switch in the discharging switch set is turned on, so that a charge transfer process is performed on the charges on the base capacitor and the cancellation capacitor. In order to avoid the transient overshoot caused by switch switching when switching directly from the first phase to the third phase, a buffering phase, that is, the second phase, may be set between the first phase and the third phase. Optionally, if total charges on the base capacitor and the cancellation capacitor are controlled to remain unchanged before and after the transfer, the charges transferred to the integrating capacitor in the third phase may be zero, thereby causing the contribution of the base capacitor to the output voltage of the amplifier to be zero.

Hereinafter, that what a relation the reference voltage, the common mode voltage, the driving voltage, the capacitance of the base capacitor and the capacitance of the cancellation capacitor satisfy may cause the contribution of the base capacitor to the output voltage of the amplifier to be zero will be introduced in detail.

Specifically, in the first phase (that is, time period T1), negative charges Q1 accumulated on a lower plate of the cancellation capacitor 220 are: $Q1=(V_{ref}-V_{tx})\times C_C$.

Positive charges Q2 accumulated on an upper plate of the base capacitor 230 are $Q2=V_{ref}\times C_S$.

That is, in the first phase, total charges Q3 of a connection node of the cancellation capacitor 220 and the base capacitor 230 are: $Q3=Q1+Q2=(V_{ref}-V_{tx})\times C_C+V_{ref}\times C_S$.

In the second phase (that is, time period T2), since the first switch 241 and the second switch 242 are simultaneously turned off, the total charges Q3 of the connection node of the cancellation capacitor 220 and the base capacitor 230 remain unchanged.

In the third phase (that is, time period T3), negative charges Q4 accumulated on the lower plate of the cancellation capacitor 220 are: $Q4=V_{com}\times C_C$, where the $C_C$ is the capacitance of the cancellation capacitor 220.

Positive charges Q5 accumulated on the upper plate of the base capacitor 230 are $Q5=V_{com}\times C_S$, where the $C_S$ is the capacitance of the base capacitance 230.

That is, in the third phase, the total charges of the connection node of the cancellation capacitor 220 and the base capacitor 230 are: $Q6=Q4+Q5=V_{com}\times(C_C+C_S)$.

If the total charges Q3 of the connection node of the cancellation capacitor 220 and the base capacitor 230 in the first phase (that is, time period T1) are equal to the total charges Q6 of the connection node of the cancellation capacitor 220 and the base capacitor 230 in the third phase (that is, time period T3), according to the law of charge conservation, the charges transferred to the integrating capacitor 251 in the third phase are zero, that is, the voltage output by the amplifier remains unchanged at $V_{com}$;

according to Q3=Q6, it can be obtained:

$$(V_{ref}-V_{tx})\times C_C+V_{ref}\times C_S=V_{com}\times(C_C+C_S), \text{ and}$$

it can be obtained the following equation (1) by simplification:

$$(V_{ref}-V_{com})\times(C_S+C_C)=V_{tx}\times C_C \qquad \text{equation (1)}$$

That is, when the reference voltage, the common mode voltage, the driving voltage, the capacitance of the base capacitor and the capacitance of the cancellation capacitor satisfy equation (1), the contribution of the base capacitor to the output voltage of the amplifier may be zero.

That is, when the reference voltage, the common mode voltage, the driving voltage, the capacitance of the base capacitor and the capacitance of the cancellation capacitor satisfy equation (1), the contribution of the base capacitance 230 to the output voltage $V_{out}$ of the amplifier is zero; and therefore, $V_{ref}$, $V_{com}$, $V_{tx}$, $C_S$, and $C_C$ may satisfy equation (1) by adjusting at least one of $V_{ref}$, $V_{com}$, $V_{tx}$, $C_S$, and $C_C$. Thus, when a conductor (such as a finger) approaches or touches the detecting electrode, the capacitance of the detecting electrode to the system ground is increased by $\Delta C_S$, and at this case, the output voltage $V_{out}$ of the amplifier 250 is:

$$V_{out}=-(V_{ref}-V_{com})\times(\Delta C_S)/C_{int} \qquad \text{equation (2)}$$

where $C_{int}$ is the capacitance of the integrating capacitor 251, and it can be seen from equation (2) that, the output voltage $V_{out}$ of the amplifier 250 is proportional to $\Delta C_S$, and is independent of the base capacitance $C_S$, thus being conducive to avoiding the problem of low sensitivity of capacitance detection when $\Delta C_S$ is small relative to $C_S$. Further, the output voltage may also be amplified, and then the information that the finger approaches or touches the detecting electrode may be obtained according to the processed output voltage.

It should be noted that in the embodiment of the present application, an assumption condition in a derivation process of the equation (1) is that the driving voltage is zero in the second phase, and if the driving voltage is not equal to zero in the second phase, other equations may also be obtained according to teachings of the derivation process given in the embodiment of the present application, as long as the reference voltage, the common mode voltage, the driving voltage, the capacitance of the base capacitor and the capacitance of the cancellation capacitor can cause the contribution of the base capacitor to the output voltage of the amplifier to be zero, which also falls within the protection scope of the present application.

It should be noted that in this embodiment, the first switch 241 and the second switch 242 are normally open switches, and the third switch 243 is a normally closed switch, and therefore, control signals of the first switch 241 and the second switch 242 are opposite to a control signal of the third switch 243, that is, when the control signals of the first switch 241 and the second switch 242 are at a low level, the first switch 241 and the second switch 242 are turned off, and when the control signal of the third switch 243 is at a low level, the third switch 243 is turned on.

Therefore, according to the capacitance detecting device of the embodiment of the present application, by designing the common mode voltage, the driving voltage, the capacitance of the base capacitor and the capacitance of the cancellation capacitor to satisfy a specific relation, the contribution of the base capacitor to the output voltage of the amplifier may be zero, thereby improving the sensitivity of the capacitance detection; the charging module is controlled by the first switch, the second switch and the third switch to achieve a process of charging and discharging the cancellation capacitor and the base capacitor, and a problem of saturation of a subsequent amplifying circuit caused by transient overshoot of a conventional cancellation circuit when driving with a square wave can be overcome.

FIG. 4 is a circuit configuration diagram of a capacitance detecting device using a differential amplifier.

In this embodiment, a capacitance detecting device 300 includes a charging module, a controlling module, a cancellation capacitor 320, a base capacitor 330 and an integrating circuit, where the integrating circuit includes a differential amplifier 350, a first integrating capacitor 351 and a second integrating capacitor 352, the differential amplifier 350 includes a first input end (that is, an inverting input end, or a negative input end), a second input end (that is, a non-inverting input end, or, a positive input end), a common mode input end, a first output end (that is, a non-inverting output end, or a positive output end) and a second output end (that is, an inverting output end, or a negative input end), a charging voltage of the charging module includes a driving voltage 311 and a reference voltage 312, a charging switch set of the controlling module includes a first switch 341, a discharging switch set of the controlling module includes a second switch 342, and a clearing switch set of the controlling module includes a third switch 343 and a fourth switch 344.

Specifically, one end of the cancellation capacitor 320 is connected to the driving voltage 311, the other end of the cancellation capacitor 320 is connected to one end of the base capacitor 330, and the other end of the base capacitor 330 is grounded;

one end of the first switch 341 is connected to the reference voltage 312, the other end of the first switch 341 is connected to one end of the base capacitor 330, and one end of the second switch 342, and the other end of the second switch 342 is connected to the first input end of the amplifier 350;

the third switch 343 is connected in parallel with the first integrating capacitor 351, one end of the first integrating capacitor 351 is connected to the first input end of the amplifier 350, and the other end of the first integrating capacitor 351 is connected to the first output end of the amplifier 350; and the fourth switch 344 is connected in parallel with the second integrating capacitor 352, one end of the second integrating capacitor 352 is connected to the second input end of the amplifier 350, the other end of the second integrating capacitor 352 is connected to the second output end of the amplifier 350, and the second input end and common mode input end of the amplifier 350 are configured to input a common mode voltage.

It should be noted that connection manners and functions of the devices or modules 311, 312, 320, 330, 341 and 342 in FIG. 4 are the same as those of the corresponding devices or modules 211, 212, 220, 230, 241 and 242 in FIG. 2, and a working state of the third switch 343 and the fourth switch 344 in FIG. 4 is the same as a working state of the third switch 243 in FIG. 2, and a working process of the capacitance detecting device shown in FIG. 4 will not be described in detail herein. Compared with the single-ended amplifier shown in FIG. 2, the differential amplifier shown in FIG. 4 is conducive to improving the anti-common-mode interference capability of the circuit, may also double the signal output by the amplifier, and may further improve detection sensitivity of the capacitance detecting device.

Optionally, as another embodiment, the charging voltage of the charging module includes a driving voltage; in the first phase, the driving voltage charges the base capacitor; and in the second phase and the third phase, the driving voltage stops charging the base capacitor.

Figure 5:
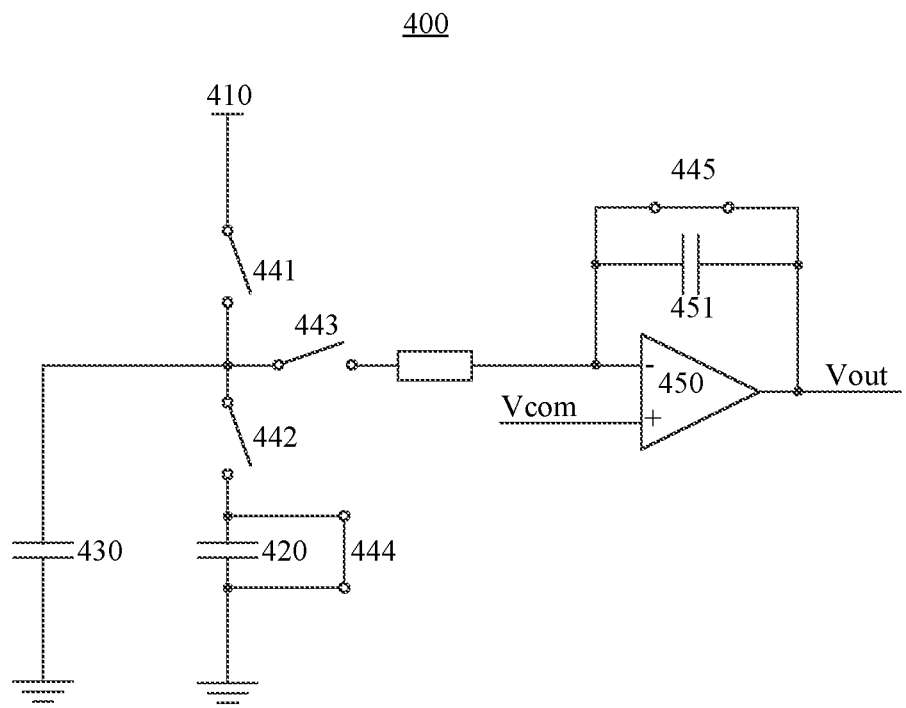
FIG. 5 is a circuit configuration diagram of a capacitance detecting device according to another embodiment of the present application.
Figure 7:
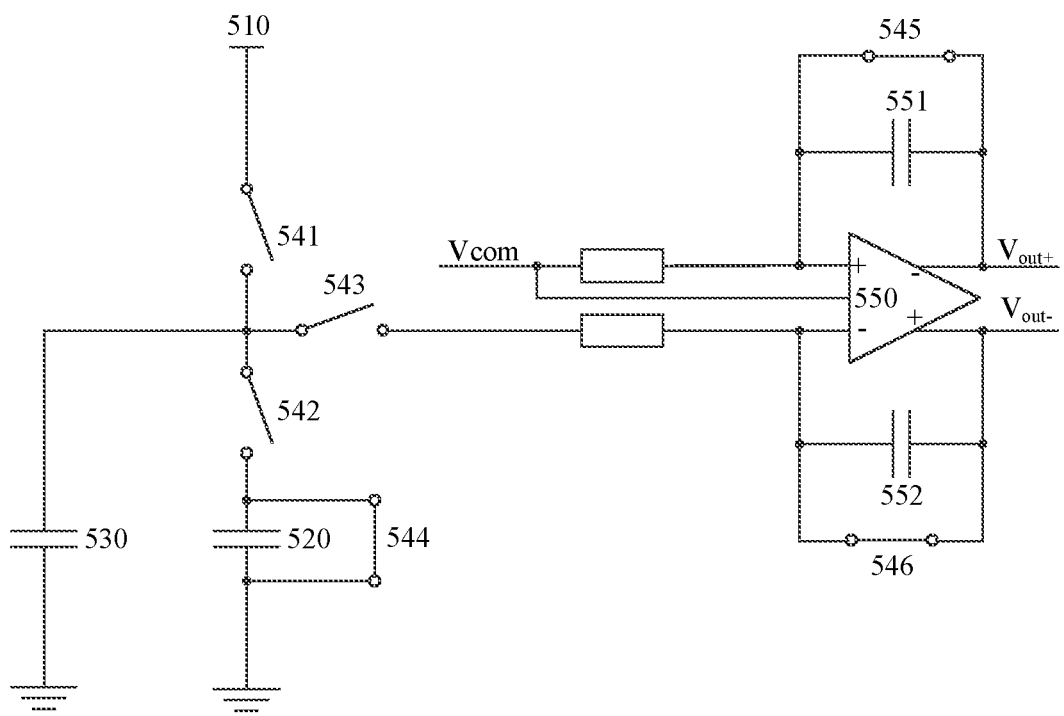
FIG. 7 is a circuit configuration diagram of a capacitance detecting device according to another embodiment of the present application.

In this embodiment, the amplifier may be in a single-ended form or in a differential form. FIG. 5 shows a circuit configuration diagram of a capacitance detecting device using a single-ended amplifier, and FIG. 7 shows a circuit configuration diagram of a capacitance detecting device using a differential amplifier, and a specific working principle will be described below in detail in conjunction with FIGS. 5 and 7.

FIG. 5 is a circuit configuration diagram of a capacitance detecting device 400 using a single-ended amplifier according to another embodiment of the present application.

In this embodiment, the capacitance detecting device 400 includes a charging module, a controlling module, a cancellation capacitor 420, a base capacitor 430 and an integrating circuit, where the integrating circuit includes an amplifier 450 and an integrating capacitor 451, the amplifier 450 is a single-ended amplifier, and includes a first input end (that is, an inverting input end, or a negative input end), a second input end (that is, a non-inverting input end, or a positive input end) and an output end; a charging voltage of the charging module includes a driving voltage 410, a charging switch set of the controlling module includes a first switch 441, a discharging switch set of the controlling module includes a second switch 442 and a third switch 443, and a clearing switch set of the controlling module includes a fourth switch 444 and a fifth switch 445.

Specifically, one end of the first switch 441 is connected to the driving voltage 410, the other end of the first switch 441 is connected to one end of the second switch 442, one end of the third switch 443 and one end of the base capacitor 430, respectively, and the other end of the base capacitor 430 is grounded;

the other end of the second switch 442 is connected to one end of the cancellation capacitor 420, and the other end of the third switch 443 is connected to the first input end of the amplifier 450; and the fourth switch 444 is connected in parallel with the cancellation capacitor 420, the fifth switch 445 is connected in parallel with the integrating capacitor 451, one end of the integrating capacitor 451 is connected to the first input end of the amplifier 450, the other end of the integrating capacitor 451 is connected to the output end of the amplifier 450, and the second input end of the amplifier 450 is configured to input a common mode voltage.

Figure 6:
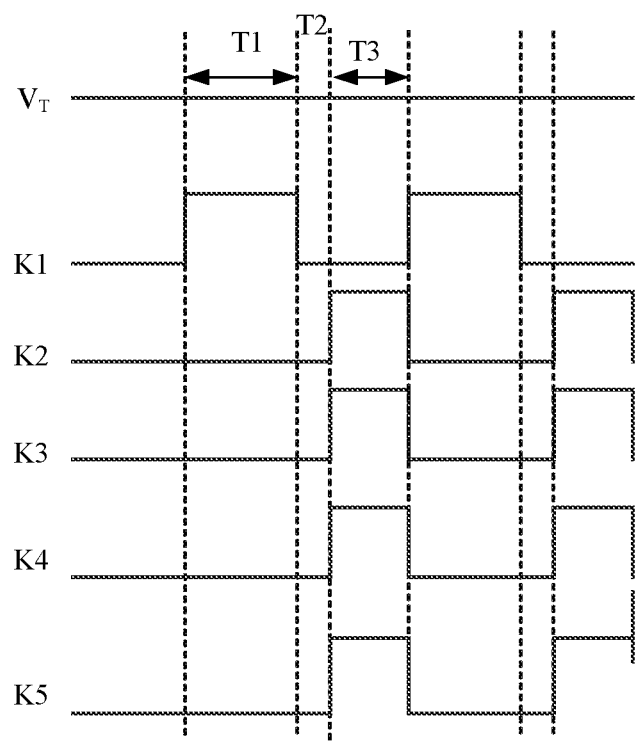
FIG. 6 is a logic timing diagram of a capacitance detecting device according to another embodiment of the present application.

Hereinafter, a working process of the capacitance detecting device shown in FIG. 5 will be described in detail in conjunction with a logical timing diagram shown in FIG. 6.

In a first phase (that is, time period T1), a charging module charges a base capacitor and charges on an integrating capacitor and a cancellation capacitor are cleared. Specifically, a first switch 441 (denoted as K1) is turned on, a second switch 442 (denoted as K2) and a third switch 443 (denoted as K3) are turned off, a driving voltage $V_T$ charges a base capacitor 430, a fourth switch 444 (denoted as K4) and a fifth switch 445 (denoted as K5) are turned on, charges on a cancellation capacitor 420 and an integrating capacitor 451 are zero, and an output voltage of an amplifier 450 is a common mode voltage $V_{com}$;

in a second phase (that is, time period T2), the first switch 441, the second switch 442 and the third switch 443 are all turned off, the driving voltage stops charging the base capacitor 430, the fourth switch 444 and the fifth switch 445 are turned on, the output voltage of the amplifier 450 is still the common mode voltage $V_{com}$, and the charges on the cancellation capacitor 420 and the integrating capacitor 451 are zero; and in a third phase (that is, time period T3), the first switch 441 is turned off, the second switch 442 and the third switch 443 are turned on, the fourth switch 444 and the fifth switch 445 are turned off, and part of the charges on the base capacitor 430 are transferred to the integrating capacitor 451 and the cancellation capacitor 420.

That is, in the first phase, the switches in the charging switch set and the clearing switch set are turned on, and the switch in the discharging switch set is turned off, so that the charging module may charge the base capacitor; in the third phase, the switches in the charging switch set and the clearing switch set are turned off, and the switch in the discharging switch set is turned on, so that a charge transfer process is performed on the charges on the base capacitor and the cancellation capacitor. In order to avoid the transient overshoot caused by switch switching when switching directly from the first phase to the third phase, a buffering phase, that is, the second phase, may be set between the first phase and the third phase. Optionally, if total charges on the base capacitor and the cancellation capacitor are controlled to remain unchanged before and after the transfer, the charges transferred to the integrating capacitor in the third phase may be zero, thereby causing the contribution of the base capacitor to the output voltage of the amplifier to be zero.

Hereinafter, that what a relation the driving voltage, the common mode voltage, and the capacitance of the base capacitor and the capacitance of the cancellation capacitor satisfy may cause the contribution of the base capacitor to the output voltage of the amplifier to be zero will be introduced in detail.

Specifically, in the first phase (that is, time period T1), positive charges Q1 accumulated on an upper plate of the cancellation capacitor 420 are 0.

Positive charges Q2 accumulated on an upper plate of the base capacitor 430 are $Q2=V_{tx} \times C_S$.

That is, in the first phase, total charges Q3 on the upper plates of cancellation capacitor 420 and the base capacitor 430 are: $Q3=Q1+Q2=V_{tx} \times C_S$.

In the second phase (that is, time period T2), since the first switch 441, the second switch 442, and the third switch 443 are simultaneously turned off, the total charges Q3 on the upper plates of the cancellation capacitor 420 and the base capacitor 430 remain unchanged.

In the third phase (that is, time period T3), positive charges Q4 accumulated on the upper plate of the cancellation capacitor 420 are: $Q4=V_{com} \times C_C$.

Positive charges Q5 accumulated on the upper plate of the base capacitor 430 are: $Q5=V_{com} \times C_S$.

That is, in the third phase, total charges Q6 on the upper plates of cancellation capacitor 420 and the base capacitor 430 are:

$$Q6=Q4+Q5=V_{com} \times (C_C+C_S)$$

where the $V_{tx}$ is an amplitude of the driving voltage 410, the $V_{com}$ is the common mode voltage, the $C_S$ is the capacitance of the base capacitor 430, and the $C_C$ is the capacitance of the cancellation capacitor 420.

If the total charges Q3 on the upper plates of the cancellation capacitor 420 and the base capacitor 430 in the first phase (that is, time period T1) are equal to the total charges Q6 on the upper plates of the cancellation capacitor 420 and the base capacitor 430 in the third phase (that is, time period T3), according to the law of charge conservation, the charges transferred to the integrating capacitor 451 in the third phase are zero, that is, the voltage output by the amplifier remains unchanged at $V_{com}$;

according to Q3=Q6, it can be obtained: $V_{tx} \times C_S = V_{com} \times (C_C+C_S)$, and further, the following equation can be obtained:

$$(V_{tx}-V_{com}) \times C_S = V_{com} \times C_C \qquad \text{equation (3)}$$

That is, when the driving voltage, the common mode voltage, the capacitance of the base capacitor and the capacitance of the cancellation capacitor satisfy equation (3), the contribution of the base capacitor to the output voltage of the amplifier may be zero.

That is, when the driving voltage, the common mode voltage, the driving voltage, the capacitance of the base capacitor and the capacitance of the cancellation capacitor satisfy equation (3), the contribution of the base capacitance 430 to the output voltage $V_{out}$ of the amplifier is zero; and therefore, $V_{com}$, $V_{tx}$, $C_S$, and $C_C$ may satisfy equation (3) by adjusting at least one of $V_{com}$, $V_{tx}$, $C_S$, and $C_C$. Thus, when a conductor (such as a finger) approaches or touches the detecting electrode, the capacitance of the detecting electrode to the system ground is increased by $\Delta C_S$, and at this case, the output voltage $V_{out}$ of the amplifier 450 is:

$$V_{out}=-(V_{tx}-V_{com}) \times (\Delta C_S)/C_{int} \qquad \text{equation (4)}$$

where $C_{int}$ is the capacitance of the integrating capacitor 451, and it can be seen from equation (4) that, the output voltage $V_{out}$ of the amplifier is proportional to $\Delta C_S$, and is independent of the base capacitance $C_S$, thus being conducive to avoiding the problem of low sensitivity of capacitance detection when $\Delta C_S$ is small relative to $C_S$. Further, the output voltage may also be amplified, and then the information that the finger approaches or touches the detecting electrode may be obtained according to the processed output voltage.

It should be noted that in the embodiment of the present application, an assumption condition in a derivation process of the equation (3) is that the driving voltage is zero in the second phase, and if the driving voltage is not equal to zero in the second phase, other equations may also be obtained according to teachings of the derivation process given in the embodiment of the present application, as long as the common mode voltage, the driving voltage, the capacitance of the base capacitor and the capacitance of the cancellation capacitor can cause the contribution of the base capacitor to the output voltage of the amplifier to be zero, which also falls within the protection scope of the present application.

It should be noted that in this embodiment, the second switch 442 and the third switch 443 have the same working state, the fourth switch 444 and the fifth switch 445 have the same working state, and the first switch 441, the second switch 442 and the third switch 443 are normally open switches, and the fourth switch 444 and the fifth switch 445 are normally closed switches.

Therefore, according to the capacitance detection device of the embodiment of the present application, by designing the driving voltage, the common mode voltage, the capacitance of the base capacitor and the capacitance of the cancellation capacitor to satisfy a specific relation, the contribution of the base capacitor to the output voltage of the amplifier may be zero, thereby improving the sensitivity of the capacitance detection; the charging module is controlled by the first switch, the second switch, the third switch, the fourth switch and the fifth switch to achieve a process of charging and discharging the base capacitor and the cancellation capacitor, and a problem of saturation of a subsequent amplifying circuit caused by transient overshoot of a conventional cancellation circuit when driving with a square wave can be overcome.

FIG. 7 is a circuit configuration diagram of a capacitance detecting device using a differential amplifier.

In this embodiment, a capacitance detecting device 500 includes a charging module, a controlling module, a cancellation capacitor 520, a base capacitor 530 and an integrating circuit; a charging voltage of the charging module includes a driving voltage 510, the integrating circuit includes a differential amplifier 550, a first integrating capacitor 551 and a second integrating capacitor 552, the differential amplifier 550 includes a first input end (that is, an inverting input end, or a negative input end), a second input end (that is, a non-inverting input end, or, a positive input end), a common mode input end, a first output end (that is, a non-inverting output end, or a positive output end) and a second output end (that is, an inverting output end, or a negative input end), a charging switch set of the controlling module includes a first switch 541, a discharging switch set of the controlling module includes a second switch 542 and a third switch 543, and a clearing switch set of the controlling module includes a fourth switch 544, a fifth switch 545 and a sixth switch 546.

Specifically, one end of the first switch 541 is connected to the driving voltage 510, the other end of the first switch 541 is connected to one end of the second switch 542, one end of the third switch 543 and one end of the base capacitor 530, respectively, and the other end of the base capacitor 530 is grounded;

the other end of the second switch 542 is connected to one end of the cancellation capacitor 520, the other end of the third switch 543 is connected to the first input end of the amplifier 550, and the fourth switch 544 is connected in parallel with the cancellation capacitor 520; and the fifth switch 545 is connected in parallel with the first integrating capacitor 551, one end of the first integrating capacitor 551 is connected to the first input end of the amplifier 550, and the other end of the first integrating capacitor 551 is connected to the first output end of the amplifier 550; and the sixth switch 546 is connected in parallel with the second integrating capacitor 552, one end of the second integrating capacitor 552 is connected to the second input end of the amplifier 550, the other end of the second integrating capacitor 552 is connected to the second output end of the amplifier 550, and the second input end and common mode input end of the amplifier 550 are configured to input a common mode voltage.

It should be noted that connection manners and functions of the devices or modules 510, 520, 530, 541, 542, 543 and 544 in FIG. 7 are the same as those of the corresponding devices or modules 410, 420, 430, 441, 442, 443 and 444 in FIG. 5, and a working state of the fifth switch 545 and the sixth switch 546 in FIG. 7 is the same as a working state of the fifth switch 445 in FIG. 5, and a working process of the capacitance detecting device shown in FIG. 7 will not be described in detail herein. Compared with the single-ended amplifier shown in FIG. 5, the differential amplifier shown in FIG. 7 is conducive to improving the anti-common-mode interference capability of the circuit, may also double the signal output by the amplifier, and may further improve detection sensitivity of the capacitance detecting device.

It should be noted that circuit configurations in FIGS. 2 to 7 are a capacitance detecting device based on a non-floating ground system in which one end of a base capacitor is connected to system ground. Hereinafter, a capacitance detecting device based on a floating ground system will be described in conjunction with FIGS. 8 to 10, and in the floating ground system, one end of a base capacitor is connected to a floating ground voltage.

Optionally, as yet another embodiment, a charging voltage of the charging module includes a driving voltage, a reference voltage and a floating ground voltage; in the first phase, the driving voltage, the reference voltage and the floating ground voltage charge the base capacitor and the cancellation capacitor; and in the second phase and the third phase, the driving voltage, the reference voltage and the floating ground voltage stop charging the base capacitor and the cancellation capacitor.

Figure 8:
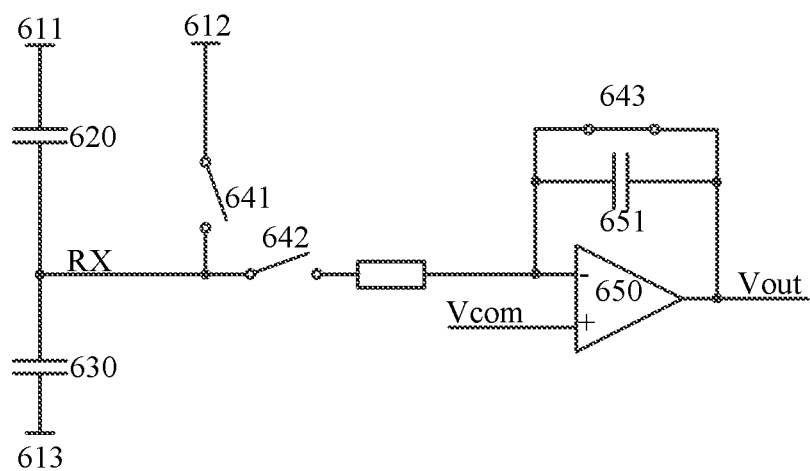
FIG. 8 is a circuit configuration diagram of a capacitance detecting device according to yet another embodiment of the present application.
Figure 10:
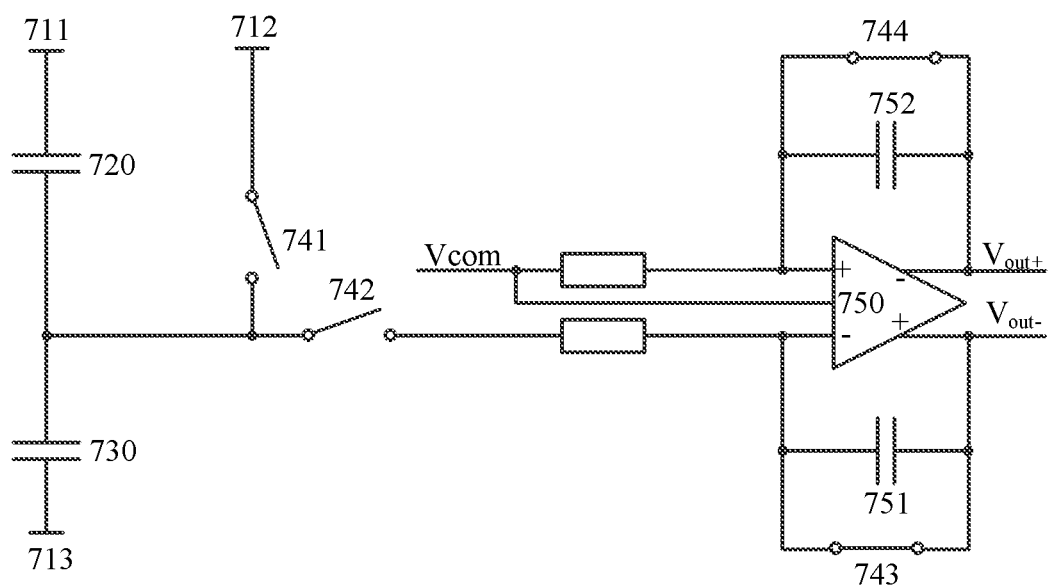
FIG. 10 is a circuit configuration diagram of a capacitance detecting device according to yet another embodiment of the present application.

In this embodiment, the amplifier may be in a single-ended form or in a differential form. FIG. 8 shows a circuit configuration diagram of a capacitance detecting device using a single-ended amplifier, and FIG. 10 shows a circuit configuration diagram of a capacitance detecting device using a differential amplifier, and a specific working principle will be described below in detail in conjunction with FIGS. 8 and 10.

FIG. 8 is a circuit configuration diagram of a capacitance detecting device 600 using a single-ended amplifier.

In this embodiment, the capacitance detecting device 600 includes a charging module, a controlling module, a cancellation capacitor 620, a base capacitor 630 and an integrating circuit, where the integrating circuit includes an amplifier 650 and an integrating capacitor 651, the amplifier 650 is a single-ended amplifier, and includes a first input end (that is, an inverting input end, or a negative input end), a second input end (that is, a non-inverting input end, or a positive input end) and an output end; a charging voltage of the charging module includes a driving voltage 611, a reference voltage 612 and a floating ground voltage 613, a charging switch set of the controlling module includes a first switch 641, a discharging switch set of the controlling module includes a second switch 642, and a clearing switch set of the controlling module includes a third switch 643;

where one end of the cancellation capacitor 620 is connected to the driving voltage 611, the other end of the cancellation capacitor 620 is connected to one end of the base capacitor 630, and the other end of the base capacitor 630 is connected to the floating ground voltage 613;

one end of the first switch 641 is connected to the reference voltage 612, the other end of the first switch 641 is connected to one end of the base capacitor 630, one end of the second switch 642, and the other end of the second switch 642 is connected to the first input end of the amplifier 650; and the third switch 643 is connected in parallel with the integrating capacitor 651, one end of the integrating capacitor 651 is connected to the first input end of the amplifier 650, the other end of the integrating capacitor 651 is connected to the output end of the amplifier 650, and the second input end of the amplifier 650 is configured to input a common mode voltage.

Figure 9:
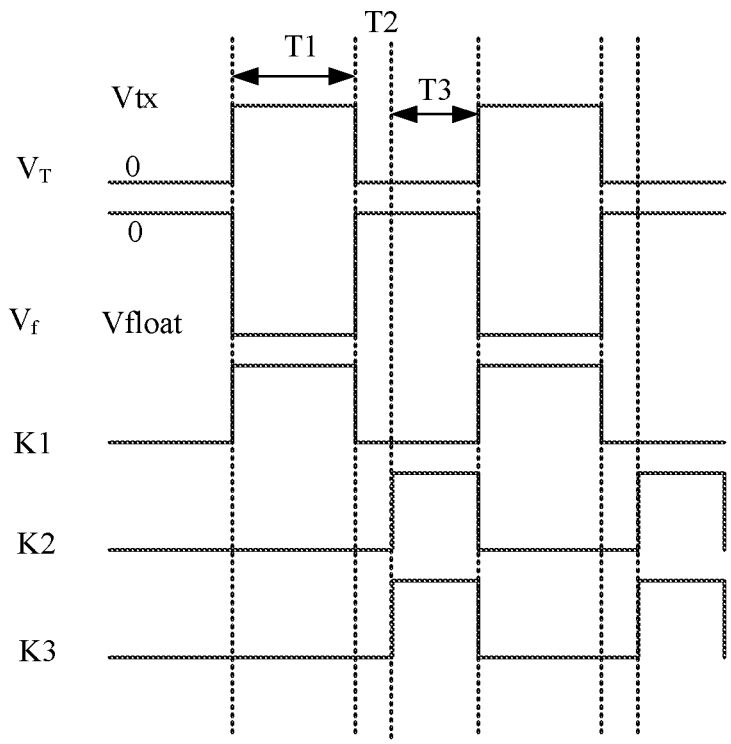
FIG. 9 is a logic timing diagram of a capacitance detecting device according to yet another embodiment of the present application.

Hereinafter, a working process of the capacitance detecting device shown in FIG. 8 will be described in detail in conjunction with a logical timing diagram shown in FIG. 9.

A first phase (that is, time period T1) is a charging phase, and in the first phase, a first switch 641 (denoted as K1) is turned on, a second switch 642 (denoted as K2) is turned off, a driving voltage 611 $V_T$, a reference voltage and a floating ground voltage $V_f$ charge a cancellation capacitor 620 and a base capacitor 630, a third switch 643 (denoted as K3) is turned on, charges on an integrating capacitor 651 are zero, and an output voltage of an amplifier 650 is a common mode voltage $V_{com}$;

a second phase (that is, time period T2) is a dead zone phase, and in the second phase, the first switch 641 and the second switch 642 are turned off, the driving voltage 611, the floating ground voltage and the reference voltage stop charging the cancellation capacitor 620 and the base capacitor 630, the third switch 643 is turned on, the output voltage of the amplifier 650 is still the common mode voltage $V_{com}$, and the charges on the integrating capacitor are still zero; and optionally, in the second phase, the driving voltage may be zero or a voltage value smaller than $V_{tx}$, and similarly, the floating ground voltage may be zero or other voltage values smaller than $V_{float}$. FIG. 9 only takes the driving voltage and the floating ground voltage being zero in the second phase as an example, and should not constitute any limitation to the embodiment of the present application.

A third phase (that is, time period T3) is a charge transfer phase, and in the third phase, the first switch 641 is turned off, the second switch 642 is turned on, and the third switch 643 is turned off, part of charges on the cancellation capacitor 620 and the base capacitor 630 are transferred to the integrating capacitor 651.

That is, in the first phase, the switches in the charging switch set and the clearing switch set are turned on, and the switch in the discharging switch set is turned off, so that the charging module may charge the base capacitor and the cancellation capacitor; in the third phase, the switches in the charging switch set and the clearing switch set are turned off, and the switch in the discharging switch set is turned on, so that a charge transfer process is performed on the charges on the base capacitor and the cancellation capacitor. In order to avoid the transient overshoot caused by switch switching when switching directly from the first phase to the third phase, a buffering phase, that is, the second phase, may be set between the first phase and the third phase. Optionally, if total charges on the base capacitor and the cancellation capacitor are controlled to remain unchanged before and after the transfer, the charges transferred to the integrating capacitor in the third phase may be zero, thereby causing the contribution of the base capacitor to the output voltage of the amplifier to be zero.

Hereinafter, that what a relation the reference voltage, the floating ground voltage, the driving voltage, the capacitance of the base capacitor and the capacitance of the cancellation capacitor satisfy may cause the contribution of the base capacitor to the output voltage of the amplifier to be zero will be introduced in detail.

Specifically, in the first phase (that is, time period T1), negative charges Q1 accumulated on a lower plate of the cancellation capacitor 620 are: $Q1=(V_{ref}-V_{tx}) \times C_C$ Positive charges Q2 accumulated on an upper plate of the base capacitor 630 are $Q2=(V_{ref}+V_{float}) \times C_S$ That is, in the first phase, total charges Q3 of a connection node of the cancellation capacitor 620 and the base capacitor 630 are: $Q3=Q1+Q2=(V_{ref}-V_{tx}) \times C_C+(V_{ref}+V_{float}) \times C_S$.

In the second phase (that is, time period T2), since the first switch 641 and the second switch 642 are simultaneously turned off, total charges Q3 of the connection node of the cancellation capacitor 620 and the base capacitor 630 remain unchanged.

In the third phase (that is, time period T3), negative charges Q4 accumulated on the lower plate of the cancellation capacitor 620 are: $Q4=V_{com} \times C_C$.

Positive charges Q5 accumulated on the upper plate of the base capacitor 630 are $Q5=V_{com} \times C_S$.

That is, in the third phase, total charges Q6 of the connection node of the cancellation capacitor 620 and the base capacitor 630 are: $Q6=Q4+Q5=V_{com} \times (C_C+C_S)$.

If the total charges Q3 of the connection node of the cancellation capacitor 620 and the base capacitor 630 in the first phase (that is, time period T1) are equal to the total charges Q6 of the connection node of the cancellation capacitor 620 and the base capacitor 630 in the third phase (that is, time period T3), according to the law of charge conservation, the charges transferred to the integrating capacitor 651 in the third phase are zero, that is, the voltage output by the amplifier remains unchanged at $V_{com}$; and according to Q3=Q6, it can be obtained:

$$(V_{ref}-V_{tx}) \times C_C+(V_{ref}+V_{float}) \times C_S=V_{com} \times (C_C+C_S).$$

The forgoing equation is a general condition that the contribution of the base capacitor to the output voltage of the amplifier is zero. In short, if it is controlled that the $V_{ref}$ is equal to $V_{com}$, a condition of the contribution of the base capacitor to the output voltage of the amplifier being zero is:

$$V_{float} \times C_S = V_{tx} \times C_C \qquad \text{equation (5)}$$

where the $V_{float}$ is an amplitude of the floating ground voltage 613, the $V_{tx}$ is an amplitude of the driving voltage $V_T$, the $C_S$ is the capacitance of the base capacitor 630, and the $C_C$ is the capacitance of the cancellation capacitor 620.

That is, when the floating ground voltage, the driving voltage, the capacitance of the base capacitor and the capacitance of the cancellation capacitor satisfy equation (5), the contribution of the base capacitance 630 to the output voltage $V_{out}$ of the amplifier is zero. Therefore, $V_{float}$, $V_{tx}$, $C_S$, and $C_C$ may satisfy equation (5) by adjusting at least one of $V_{float}$, $V_{tx}$, $C_S$, and $C_C$. Thus, when a conductor (such as a finger) approaches or touches the detecting electrode, the capacitance of the detecting electrode to the system ground is increased by $\Delta C_S$, and at this case, the output voltage $V_{out}$ of the amplifier 650 is:

$$V_{out} = -V_{float} \times (\Delta C_S)/C_{int} \qquad \text{equation (6)}$$

$C_{int}$ is the capacitance of the integrating capacitor 651, and it can be seen from equation (6) that, the output voltage $V_{out}$ of the amplifier is proportional to $\Delta C_S$, and is independent of the base capacitance $C_S$, thus being conducive to avoiding the problem of low sensitivity of capacitance detection when $\Delta C_S$ is small relative to $C_S$. Further, the output voltage may also be amplified, and then the information that the finger approaches or touches the detecting electrode can be obtained according to the processed output voltage.

It should be noted that in the embodiment of the present application, an assumption condition in a derivation process of the equation (5) is that the driving voltage and the floating ground voltage are zero in the second phase, and if the driving voltage and the floating ground voltage are not equal to zero in the second phase, other equations may also be obtained according to teachings of the derivation process given in the embodiment of the present application, as long as the reference voltage, the common mode voltage, the driving voltage, the floating ground voltage, the capacitance of the base capacitor and the capacitance of the cancellation capacitor can cause the contribution of the base capacitor to the output voltage of the amplifier to be zero, which also falls within the protection scope of the present application.

It should be noted that, in this embodiment, the first switch 641 and the second switch 642 are normally open switches, and the third switch 643 is a normally closed switch, and therefore, control signals of the first switch 641 and the second switch 642 are opposite to a control signal of the third switch 643, that is, when the control signals of the first switch 641 and the second switch 642 are at a low level, the first switch 641 and the second switch 642 are turned off, and when the control signal of the third switch 643 is at a low level, the third switch 643 is turned on.

Therefore, according to the capacitance detecting device of the embodiment of the present application, by designing the driving voltage, the floating ground voltage, the capacitance of the base capacitor and the capacitance of the cancellation capacitor to satisfy a specific relation, the contribution of the base capacitor to the output voltage of the amplifier may be zero, thereby improving the sensitivity of the capacitance detection; the charging module is controlled by the first switch, the second switch and the third switch to achieve a process of charging and discharging the base capacitor and the cancellation capacitor, and a problem of saturation of a subsequent amplifying circuit caused by transient overshoot of a conventional cancellation circuit when driving with a square wave can be overcome.

FIG. 10 is a circuit configuration diagram of a capacitance detecting device using a differential amplifier.

In this embodiment, a capacitance detecting device 700 includes a charging module, a controlling module, a cancellation capacitor 720, a base capacitor 730, and an integrating circuit. The integrating circuit includes a differential amplifier 750, a first integrating capacitor 751 and a second integrating capacitor 752, the differential amplifier 750 includes a first input end (that is, an inverting input end, or a negative input end), a second input end (that is, a non-inverting input end, or, a positive input end), a common mode input end, a first output end (that is, a non-inverting output end, or a positive output end) and a second output end (that is, an inverting output end, or a negative input end), a charging voltage of the charging module includes a driving voltage 711, a reference voltage 712 and a floating ground voltage 713, a charging switch set of the controlling module includes a first switch 741, a discharging switch set of the controlling module includes a second switch 742, and a clearing switch set of the controlling module includes a third switch 743 and a fourth switch 744;

one end of the cancellation capacitor 720 is connected to the driving voltage 711, the other end of the cancellation capacitor 720 is connected to one end of the base capacitor 730, and the other end of the base capacitor 730 is connected to the floating ground voltage 713;

one end of the first switch 741 is connected to the reference voltage 712, the other end of the first switch 741 is connected to one end of the base capacitor 730 and one end of the second switch 742, and the other end of the second switch 742 is connected to the first input end of the amplifier 750;

the third switch 742 is connected in parallel with the first integrating capacitor 751, one end of the first integrating capacitor 751 is connected to the first input end of the amplifier 750, and the other end of the first integrating capacitor 751 is connected to the first output end of the amplifier 750; and the fourth switch 744 is connected in parallel with the second integrating capacitor 752, one end of the second integrating capacitor 752 is connected to the second input end of the amplifier 750, the other end of the second integrating capacitor 752 is connected to the second output end of the amplifier 750, and the second input end and common mode input end of the amplifier 750 are configured to input a common mode voltage.

It should be noted that connection manners and functions of the devices or modules 711, 712, 713, 720, 730, 741 and 742 in FIG. 10 are the same as those of the corresponding devices or modules 611, 612, 613, 620, 630, 641 and 642 in FIG. 8, and a working state of the third switch 743 and the fourth switch 744 in FIG. 10 is the same as a working state of the third switch 643 in FIG. 8, and a working process of the capacitance detecting device shown in FIG. 10 will not be described in detail herein. Compared with the single-ended amplifier shown in FIG. 8, the differential amplifier shown in FIG. 10 is conducive to improving the anti-common-mode interference capability of the circuit, may also double the signal output by the amplifier, and may further improve the detection sensitivity of the capacitance detecting device.

Figure 11:
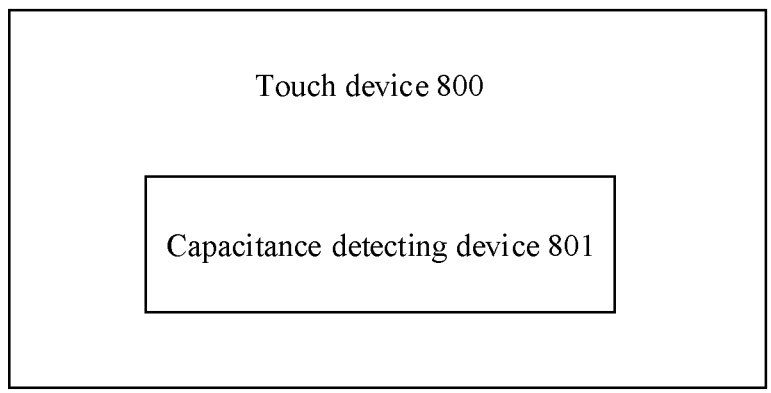
FIG. 11 is a schematic structural diagram of a touch device according to an embodiment of the present application.

An embodiment of the present application also provides a touch device, FIG. 11 shows a schematic structural diagram of a touch device 800 of an embodiment of the present application, and as shown in FIG. 11, the touch device may include a capacitance detecting device 801 which may be the capacitance detecting device described in the foregoing embodiments. Optionally, the touch device may further include a processing module which may also be configured to process a signal ($V_{out}$) output by the capacitance detecting device 801, for example, performing filtering processing, amplification processing, and the like on $V_{out}$ to further determine information such as a touch position. Compared with a conventional touch device, the touch device of the capacitance detecting device of the embodiment of the application can improve sensitivity of touch detection.

Figure 12:
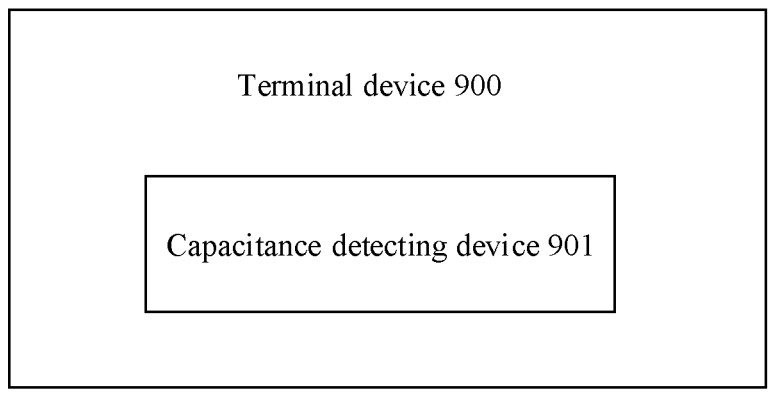
FIG. 12 is a schematic structural diagram of a terminal device according to an embodiment of the present application.

An embodiment of the present application also provides a terminal device, FIG. 12 shows a schematic structural diagram of a terminal device 900 of an embodiment of the present application, and as shown in FIG. 12, the terminal device may include a capacitance detecting device 901 which may be the capacitance detecting device described in the foregoing embodiments, and the capacitance detecting device may be configured to detect information that a conductor (such as a finger) approaches or touches the capacitance detecting device.

By way of example but not limitation, the terminal device 900 may be a mobile phone, a tablet computer, a notebook computer, a desktop computer, an in-vehicle electronic device, a wearable smart device, or the like.

The foregoing descriptions are merely specific embodiments of the present application, but the protection scope of the present application is not limited thereto, persons skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A capacitance detecting device, comprising:
    a charging module, configured to charge a base capacitor between a detecting electrode and system ground;
    an integrating circuit comprising an amplifier and an integrating capacitor, wherein the integrating capacitor is connected in parallel with the amplifier, and the integrating circuit is configured to integrate, through the integrating capacitor, charges transferred from the base capacitor;
    a cancellation capacitor, configured to cancel a contribution of the base capacitor to an output voltage of the amplifier; and
    a controlling module, configured to control the charging module to charge the base capacitor in a first phase, control the charging module to stop charging the base capacitor in a second phase, and control transfer of the charges on the base capacitor to the integrating capacitor in a third phase;
    wherein a charging voltage of the charging module, a capacitance of the integrating capacitor and a capacitance of the cancellation capacitor cause the contribution of the base capacitor to the output voltage of the amplifier to be zero.

2. The capacitance detecting device according to claim 1, wherein the controlling module comprises a charging switch set, a discharging switch set and a clearing switch set, the charging switch set is connected to the charging module, one end of the discharging switch set is connected to the charging module, and the other end of the discharging switch set is connected to the integrating circuit;
    wherein the charging switch set is configured to control the charging module to charge the base capacitor in the first phase, and stop charging the base capacitor in the second phase and the third phase;
    the discharging switch set is configured to control the transfer of the charges on the base capacitor to the integrating capacitor in the third phase; and
    the clearing switch set is configured to control clear of charges on the integrating capacitor in the first phase and the second phase.

3. The capacitance detecting device according to claim 2, wherein the charging voltage of the charging module comprises a driving voltage and a reference voltage; in the first phase, the driving voltage and the reference voltage charge the base capacitor and the cancellation capacitor; and in the second phase and the third phase, the driving voltage and the reference voltage stop charging the base capacitor and the cancellation capacitor.

4. The capacitance detecting device according to claim 3, wherein the charging switch set comprises a first switch, and the discharging switch set comprises a second switch, one end of the cancellation capacitor is connected to the driving voltage, the other end of the cancellation capacitor is connected to one end of the base capacitor, and the other end of the base capacitor is grounded; and
    one end of the first switch is connected to the reference voltage, the other end of the first switch is connected to one end of the base capacitor and one end of the second switch, and the other end of the second switch is connected to the amplifier.

5. The capacitance detecting device according to claim 4, wherein the amplifier is a single-ended amplifier, the amplifier comprises a first input end, a second input end and an output end, the clearing switch set comprises a third switch, the third switch is connected in parallel with the integrating capacitor, one end of the integrating capacitor is connected to the first input end of the amplifier, the other end of the integrating capacitor is connected to the output end of the amplifier, and the second input end of the amplifier is configured to input a common mode voltage;
    or the amplifier is a differential amplifier comprising a first input end, a second input end, a common mode input end, a first output end and a second output end, wherein the integrating capacitor comprises a first integrating capacitor and a second integrating capacitor, and the clearing switch set comprises a third switch and a fourth switch; the third switch is connected in parallel with the first integrating capacitor, one end of the first integrating capacitor is connected to the first input end of the amplifier, and the other end of the first integrating capacitor is connected to the first output end of the amplifier; the fourth switch is connected in parallel with the second integrating capacitor, one end of the second integrating capacitor is connected to the second input end of the amplifier, the other end of the second integrating capacitor is connected to the second output end of the amplifier, and the second input end and the common mode input end of the amplifier are configured to input a common mode voltage.

6. The capacitance detecting device according to claim 5, wherein when the amplifier is a single-ended amplifier, in the first phase, the first switch is turned on, the second switch is turned off, and the third switch is turned on, the driving voltage and the reference voltage charge the cancellation capacitor and the base capacitor, charges on the integrating capacitor are zero, and the output voltage of the amplifier is the common mode voltage; in the second phase, the first switch and the second switch are turned off, and the third switch is turned on, the driving voltage and the reference voltage stop charging the cancellation capacitor and the base capacitor, and the output voltage of the amplifier is the common mode voltage; and in the third phase, the first switch is turned off, the second switch is turned on, and the third switch is turned off, and charges on the cancellation capacitor and the base capacitor are transferred to the integrating capacitor;
    or when the amplifier is a differential amplifier, in the first phase, the first switch is turned on, the second switch is turned off, and the third switch and the fourth switch are turned on, the driving voltage and the reference voltage charge the cancellation capacitor and the base capacitor, and charges on the first integrating capacitor and the second integrating capacitor are zero; in the second phase, the first switch and the second switch are turned off, and the third switch and the fourth switch are turned on, the driving voltage and the reference voltage stop charging the cancellation capacitor and the base capacitor; and in the third phase, the first switch is turned off, the second switch is turned on, the third switch and the fourth switch are turned off, and charges on the cancellation capacitor and the base capacitor are transferred to the first integrating capacitor.

7. The capacitance detecting device according to claim 3, wherein the reference voltage, the common mode voltage, the driving voltage, a capacitance of the base capacitor and the capacitance of the cancellation capacitor satisfy the following equation such that the contribution of the base capacitor to the output voltage of the amplifier is zero:

$$(V_{ref} - V_{com}) \times (C_S + C_C) = V_{tx} \times C_C$$

wherein the $V_{ref}$ is an amplitude of the reference voltage, the $V_{com}$ is the common mode voltage, the $V_{tx}$ is an amplitude of the driving voltage, the $C_S$ is the capacitance of the base capacitor, and the $C_C$ is the capacitance of the cancellation capacitor.

8. The capacitance detecting device according to claim 2, wherein the charging voltage of the charging module comprises a driving voltage; in the first phase, the driving voltage charges the base capacitor; in the second phase and the third phase, the driving voltage stops charging the base capacitor.

9. The capacitance detecting device according to claim 8, wherein the charging switch set comprises a first switch, and the discharging switch set comprises a second switch and a third switch;
one end of the first switch is connected to the driving voltage, the other end of the first switch is connected to one end of the second switch, one end of the third switch and one end of the base capacitor, and the other end of the base capacitor is grounded; and
the other end of the second switch is connected to one end of the cancellation capacitor, and the other end of the third switch is connected to the amplifier.

10. The capacitance detecting device according to claim 9, wherein the amplifier is a single-ended amplifier, the amplifier comprises a first input end, a second input end and an output end, the clearing switch set comprises a fourth switch and a fifth switch, the fourth switch is connected in parallel with the cancellation capacitor, the fifth switch is connected in parallel with the integrating capacitor, one end of the integrating capacitor is connected to the first input end of the amplifier, the other end of the integrating capacitor is connected to the output end of the amplifier, and the second input end of the amplifier is configured to input a common mode voltage;
or the amplifier is a differential amplifier comprising a first input end, a second input end, a common mode input end, a first output end and a second output end, the integrating capacitor comprises a first integrating capacitor and a second integrating capacitor, and the clearing switch set comprises a fourth switch, a fifth switch and a sixth switch; wherein the fourth switch is connected in parallel with the cancellation capacitor; the fifth switch is connected in parallel with the first integrating capacitor, one end of the first integrating capacitor is connected to the first input end of the amplifier, and the other end of the first integrating capacitor is connected to the first output end of the amplifier; the sixth switch is connected in parallel with the second integrating capacitor, one end of the second integrating capacitor is connected to the second input end of the amplifier, the other end of the second integrating capacitor is connected to the second output end of the amplifier, and the second input end and the common mode input end of the amplifier are configured to input a common mode voltage.

11. The capacitance detecting device according to claim 10, wherein when the amplifier is a single-ended amplifier, in the first phase, the first switch is turned on, the second switch and the third switch are turned off, and the fourth switch and the fifth switch are turned on, the driving voltage charges the base capacitor, charges on the cancellation capacitor and the integrating capacitor are zero, and the output voltage of the amplifier is the common mode voltage; in the second phase, the first switch, the second switch and the third switch are turned off, and the fourth switch and the fifth switch are turned on, the driving voltage stops charging the base capacitor, and the output voltage of the amplifier is the common mode voltage; and in the third phase, the first switch is turned off, the second switch and the third switch are turned on, and the fourth switch and the fifth switch are turned off, and charges on the base capacitor are transferred to the integrating capacitor and the cancellation capacitor;
or when the amplifier is a differential amplifier, in the first phase, the first switch is turned on, the second switch and the third switch are turned off, and the fourth switch, the fifth switch and the sixth switch are turned on, the driving voltage charges the base capacitor, charges on the cancellation capacitor, the first integrating capacitor and the second integrating capacitor are zero, and the output voltage of the amplifier is the common mode voltage; in the second phase, the first switch, the second switch, and the third switch are turned off, and the fourth switch, the fifth switch, and the sixth switch are turned on, and the driving voltage stops charging the base capacitor, and the output voltage of the amplifier is the common mode voltage; and in the third phase, the first switch is turned off, the second switch and the third switch are turned on, and the fourth switch, the fifth switch and the sixth switch are turned off, and charges on the base capacitor are transferred to the first integrating capacitor and the cancellation capacitor.

12. The capacitance detecting device according to claim 8, wherein the driving voltage, the common mode voltage, and a capacitance of the base capacitor and the capacitance of the cancellation capacitor satisfy the following equation such that the contribution of the base capacitor to the output voltage of the amplifier is zero:

$$(V_{tx} - V_{com}) \times C_S = V_{com} \times C_C$$

wherein the $V_{tx}$ is an amplitude of the driving voltage, the $V_{com}$ is the common mode voltage, the $C_S$ is the capacitance of the base capacitor, and the $C_C$ is the capacitance of the cancellation capacitor.

13. The capacitance detecting device according to claim 2, wherein the charging voltage of the charging module comprises a driving voltage, a reference voltage and a floating ground voltage; in the first phase, the driving voltage, the reference voltage and the floating ground voltage charge the base capacitor and the cancellation capacitor; and in the second phase and the third phase, the driving voltage, the reference voltage and the floating ground voltage stop charging the base capacitor and the cancellation capacitor.

14. The capacitance detecting device according to claim 13, wherein the charging switch set comprises a first switch, and the discharging switch set comprises a second switch;

wherein one end of the cancellation capacitor is connected to the driving voltage, the other end of the cancellation capacitor is connected to one end of the base capacitor, and the other end of the base capacitor is connected to the floating ground voltage; and one end of the first switch is connected to the reference voltage, the other end of the first switch is connected to one end of the base capacitor and one end of the second switch, and the other end of the second switch is connected to the amplifier.

15. The capacitance detecting device according to claim 14, wherein the amplifier is a single-ended amplifier, the amplifier comprises a first input end, a second input end and an output end, the clearing switch set comprises a third switch, the third switch is connected in parallel with the integrating capacitor, one end of the integrating capacitor is connected to the first input end of the amplifier, the other end of the integrating capacitor is connected to the output end of the amplifier, and the second input end of the integrating capacitor is configured to input a common mode voltage;

or the amplifier is a differential amplifier comprising a first input end, a second input end, a common mode input end, a first output end and a second output end, the integrating capacitor comprises a first integrating capacitor and a second integrating capacitor, and the clearing switch set comprises a third switch and a fourth switch; wherein the third switch is connected in parallel with the first integrating capacitor, one end of the first integrating capacitor is connected to the first input end of the amplifier, and the other end of the first integrating capacitor is connected to the first output end of the amplifier; the fourth switch is connected in parallel with the second integrating capacitor, one end of the second integrating capacitor is connected to the second input end of the amplifier, the other end of the second integrating capacitor is connected to the second output end of the amplifier, and the second input end and the common mode input end of the amplifier are configured to input a common mode voltage.

16. The capacitance detecting device according to claim 15, wherein when the amplifier is a single-ended amplifier, in the first phase, the first switch is turned on, the second switch is turned off, and the third switch is turned on, the driving voltage, the reference voltage and the floating ground voltage charge the cancellation capacitor and the base capacitor, and the output voltage of the amplifier is the common mode voltage; in the second phase, the first switch and the second switch are turned off, and the third switch is turned on, the driving voltage, the reference voltage and the floating ground voltage stop charging the cancellation capacitor and the base capacitor, and the output voltage of the amplifier is the common mode voltage; and in the third phase, the first switch is turned off, the second switch is turned on, and the third switch is turned off, and charges on the cancellation capacitor and the base capacitor are transferred to the integrating capacitor;

or when the amplifier is a differential amplifier, in the first phase, the first switch is turned on, the second switch is turned off, and the third switch and the fourth switch are turned on, the driving voltage, the reference voltage and the floating ground voltage charge the cancellation capacitor and the base capacitor, and the output voltage of the amplifier is the common mode voltage; in the second phase, the first switch and the second switch are turned off, and the third switch and the fourth switch are turned on, the driving voltage, the reference voltage and the floating ground voltage stop charging the cancellation capacitor and the base capacitor, and the output voltage of the amplifier is the common mode voltage; and in the third phase, the first switch is turned off, the second switch is turned on, and the third switch and the fourth switch are turned off, charges on the cancellation capacitor and the base capacitor are transferred to the first integrating capacitor.

17. The capacitance detecting device according to claim 13, wherein the floating ground voltage, the driving voltage, and a capacitance of the base capacitor and the capacitance of the cancellation capacitor satisfy the following equation such that the contribution of the base capacitor to the output voltage of the amplifier is zero:

$$V_{float} \times C_S = V_{tx} \times C_C$$

wherein the $V_{float}$ is an amplitude of the floating ground voltage, the $V_{tx}$ is an amplitude of the driving voltage, the $C_S$ is the capacitance of the base capacitor, and the $C_C$ is the capacitance of the cancellation capacitor.

18. A touch device, comprising: a capacitance detecting device;

wherein the capacitance detecting device comprising:

a charging module, configured to charge a base capacitor between a detecting electrode and system ground;

an integrating circuit comprising an amplifier and an integrating capacitor, wherein the integrating capacitor is connected in parallel with the amplifier, and the integrating circuit is configured to integrate, through the integrating capacitor, charges transferred from the base capacitor;

a cancellation capacitor, configured to cancel a contribution of the base capacitor to an output voltage of the amplifier; and a controlling module, configured to control the charging module to charge the base capacitor in a first phase, control the charging module to stop charging the base capacitor in a second phase, and control transfer of the charges on the base capacitor to the integrating capacitor in a third phase;

wherein a charging voltage of the charging module, a capacitance of the integrating capacitor and a capacitance of the cancellation capacitor cause the contribution of the base capacitor to the output voltage of the amplifier to be zero.

19. A terminal device, comprising: a capacitance detecting device;

wherein the capacitance detecting device comprising:

a charging module, configured to charge a base capacitor between a detecting electrode and system ground;

an integrating circuit comprising an amplifier and an integrating capacitor, wherein the integrating capacitor is connected in parallel with the amplifier, and the integrating circuit is configured to integrate, through the integrating capacitor, charges transferred from the base capacitor;

a cancellation capacitor, configured to cancel a contribution of the base capacitor to an output voltage of the amplifier; and a controlling module, configured to control the charging module to charge the base capacitor in a first phase, control the charging module to stop charging the base capacitor in a second phase, and control transfer of the charges on the base capacitor to the integrating capacitor in a third phase;

wherein a charging voltage of the charging module, a capacitance of the integrating capacitor and a capacitance of the cancellation capacitor cause the contribution of the base capacitor to the output voltage of the amplifier to be zero.

* * * * *